United States Patent [19]
Fruth et al.

[11] Patent Number: 5,736,755
[45] Date of Patent: Apr. 7, 1998

[54] VERTICAL PNP POWER DEVICE WITH DIFFERENT BALLASTIC RESISTANT VERTICAL PNP TRANSISTORS

[75] Inventors: John Rothgeb Fruth, Kokomo; John Kevin Kaszyca, Lafayette; Mark Wendell Gose, Kokomo, all of Ind.

[73] Assignee: Delco Electronics Corporation, Kokomo, Ind.

[21] Appl. No.: 525,894

[22] Filed: Sep. 8, 1995

Related U.S. Application Data

[63] Continuation of Ser. No. 129,993, Sep. 30, 1993, abandoned, which is a continuation-in-part of Ser. No. 973,503, Nov. 9, 1992, abandoned.

[51] Int. Cl.⁶ .................. H01L 27/082; H01L 27/102; H01L 29/70
[52] U.S. Cl. .................. 257/166; 257/164; 257/536; 257/539; 257/542; 257/563; 257/564; 257/580; 257/582; 257/584
[58] Field of Search .................. 257/163, 164, 257/165, 166, 379, 380, 536, 537, 539, 542, 543, 578, 579, 580, 581, 582, 583, 584, 563, 564

[56] References Cited

U.S. PATENT DOCUMENTS

| | | | |
|---|---|---|---|
| 3,524,113 | 8/1970 | Agusta et al. | 257/566 |
| 3,579,060 | 5/1971 | Davis | 257/166 |
| 3,911,461 | 10/1975 | Clark | 257/565 |
| 4,126,879 | 11/1978 | Kessler et al. | 257/581 |
| 4,157,561 | 6/1979 | Nawata et al. | 257/580 |
| 4,231,059 | 10/1980 | Hower et al. | 357/68 |
| 4,252,582 | 2/1981 | Anantha et al. | 257/565 |
| 4,443,810 | 4/1984 | Yatsuo et al. | 257/166 |
| 4,786,959 | 11/1988 | Shimizu et al. | 257/166 |
| 4,835,588 | 5/1989 | Nawata et al. | 257/580 |

FOREIGN PATENT DOCUMENTS

| | | | |
|---|---|---|---|
| 2830625 | 8/1979 | Germany | 257/164 |
| 50-175780 | 12/1975 | Japan . | |
| 51-32935 | 3/1976 | Japan . | |
| 52-133691 | 11/1977 | Japan . | |
| 54-177468 | 12/1977 | Japan . | |

*Primary Examiner*—Mahshid Saadat
*Assistant Examiner*—Alice W. Tang
*Attorney, Agent, or Firm*—Jimmy L. Funke

[57] ABSTRACT

Disclosed are devices having emitters having resistive emitter diffusion sections are in a radial pattern. Such devices include vertical PNP power devices. The radial pattern of holes defines resistive emitter diffusion sections between adjacent holes. The resistive emitter diffusion sections result in a lower emitter ballast resistance due to the higher emitter sheet resistance of PNP devices. This allows all the periphery of the emitter to be active, not just two sides. The device has improved emitter ballast resistance while at the same time remaining efficient with low saturation resistance.

15 Claims, 3 Drawing Sheets

VERTICAL PNP POWER DEVICE WITH DIFFERENT BALLASTIC RESISTANT VERTICAL PNP TRANSISTORS

This is a continuation of U.S. application Ser. No. 08/129,993 filed on Sep. 30, 1993, now abandoned, which is a continuation-in-part of U.S. application Ser. No. 07/973,503 filed Nov. 9, 1992, now abandoned.

FIELD OF THE INVENTION

This invention relates to vertical PNP devices, and more particularly to a novel structure for vertical PNP devices achieving improved performance.

BACKGROUND OF THE INVENTION

A prior art PNP device 10 is shown in FIG. 1. Such a device uses small squares of P+ emitter diffusion 12, contacts 14, N+ base 16, and N-type base material 15 and P+ collector 17 all connected together to form a power device emitter. The contacts 14 are near the edge of the emitter diffusion and cause the device to have little emitter resistance to ballast it against secondary breakdown. A secondary breakdown phenomena occurs in bipolar devices when a part of the device gets hotter than another. This causes that part of the device to flow more current than the cooler part of the device. This in turn makes the hot part of the device get even hotter. This continues until that part is so hot that it destroys the device. A well-known method to improve the durability of PNP devices is to incorporate ballast resistance in the emitter leg of the transistor. This will tend to shut-off any part of the device trying to source excessive current.

NPN transistors include a base 18, emitter 20, collector 22, contact 24 and often utilize a "H" structure 26 to restrict current build up, as shown in FIG. 2. In such a system, the emitter diffusion is put down with a "H" shape hole in the emitter diffusion. The "H" shaped holes in the emitter diffusion define resistive areas 25 in the emitter diffusion where there is a lesser area for current to flow in route from the contact 24 to the collector 22. All the current flows through the resistive areas of the diffusion before reaching the active transistor area at the periphery thereby restricting current build up. For high reverse bias conditions (high voltage operations), only the outer part of the emitter is active as a source of current. The resistive areas in NPN "H" emitter structures are only on two sides, because the emitter sheet resistance is very low. This causes the device to be less efficient because there is series resistance to the remaining periphery of the emitter.

These "H" shaped emitter structures, are not desirable for vertical PNPs because such structures result in too much emitter resistance. This is because the emitter sheet resistance for PNP emitters is much higher than that of NPN emitters (5–20 times greater). This would result in higher saturation resistance and a less efficient device.

The present invention overcomes the deficiencies of the prior art.

SUMMARY OF THE INVENTION

In general, the present invention includes devices having emitters with holes formed in the emitter diffusion in a radial pattern. The restricted or lesser area between adjacent holes define a resistive emitter diffusion section. Thus, the resistive emitter diffusion sections are also in a radial pattern. Such devices include vertical PNP power devices. The radial pattern of resistive emitter diffusion sections results in a lower emitter ballast resistance than "H"-type structures. This is desirable because of the higher emitter sheet resistance of PNP devices. This allows all the periphery of the emitter to be active, not just two sides as in "H" structure NPN devices. The present invention device has improved emitter ballast resistance while at the same time remaining efficient with low saturation resistance.

These and other objects, features and advantages will be apparent from the following brief description of the drawings, detailed description and appended claims and drawings.

DETAILED DESCRIPTION

Figure 3:
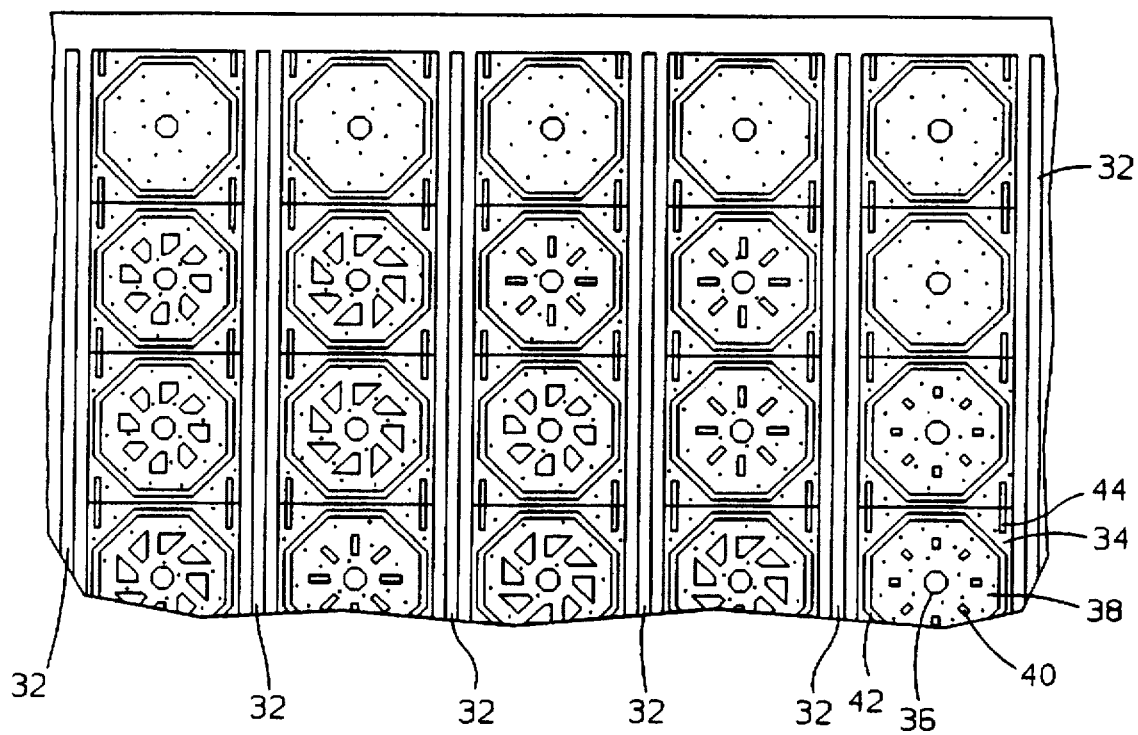
FIG. 3 is an illustration of a kiwi vertical PNP device according to the present invention having radially positioned kiwi-shaped emitters.

A device according to the present invention is called a kiwi vertical PNP because it resembles a kiwi fruit cut in half by a plane perpendicular to the axis of the kiwi. Holes are radially positioned like seeds in a kiwi fruit. A silicon material which has been doped with an impurity to make it N-type is used to form a base for the device. A P-type diffusion material is introduced in an octagonal pattern to form an emitter of the device, like the meat of a kiwi. The holes (or seeds of the kiwi-shaped device) are not doped with a P-type material, so they remain N-type forming a junction. The holes (or seeds) could also be formed by forming a dielectric insulating material in the base. A contact to the emitter is located at the center. As shown in FIG. 3, a kiwi vertical PNP includes a collector 32, a base 34, contact 36 and an emitter 38 having holes 40.

Figure 4:
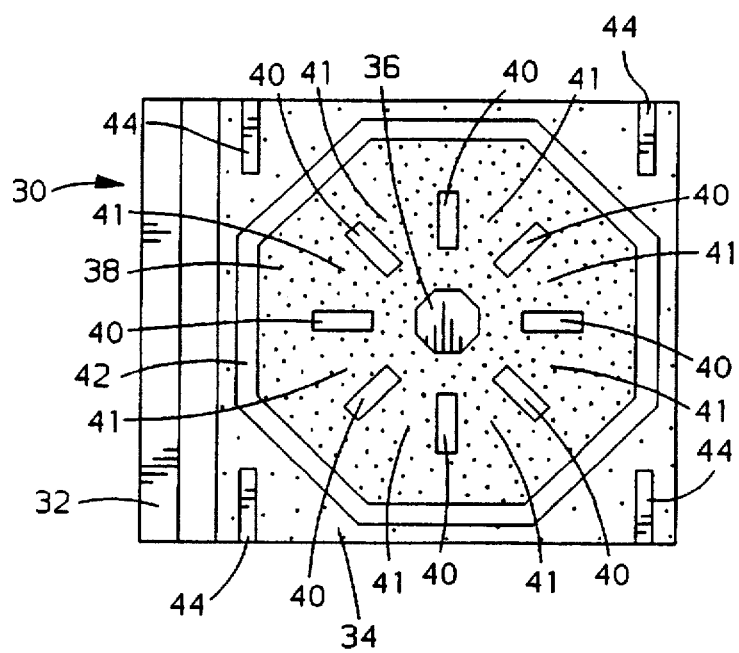
FIG. 4 is an illustration of a kiwi-shaped emitter having rectangular-shaped holes defining resistive emitter diffusion sections radially positioned according to the present invention.

FIG. 4 is an enlargement a PNP device 30 of FIG. 3 including a collector 32, base 34, contact 36, an emitter 38 and "seeds" 40 formed therein to define resistive emitter diffusion sections 41 in a radial pattern. A N– epi area 42 may isolate the P+ type emitter from the N+ base. Base contact pads 44 are formed in the base. The contact is a metal-silicon interface. The emitter is a P-type material and the seeds are N-type base material. The contact, emitter, and seeds or hole are formed by selective ion implant techniques and oxide etch techniques known to those skilled in the art. For an emitter as shown in FIG. 4, the rectangular-shaped holes have length ranging from about 10 µm to about 50 µm and a width ranging from about 4 µm to about 20 µm, and preferably a length of about 14 microns and a width of about 6 microns. The rectangular-shaped "seeds" are centered radially a distance of about 16 microns from the center of the contact.

FIGS. 4–7 are of similar construction with the difference being the shape of the holes in the P-type emitter. The collector, contact emitter, base and holes may be formed in a silicon material by selective doping techniques. The contact emitter, base and holes are in the same plane of the silicon material so that the current flows laterally from the contact, through the emitter diffusion and around the holes towards the collector.

Figure 5:
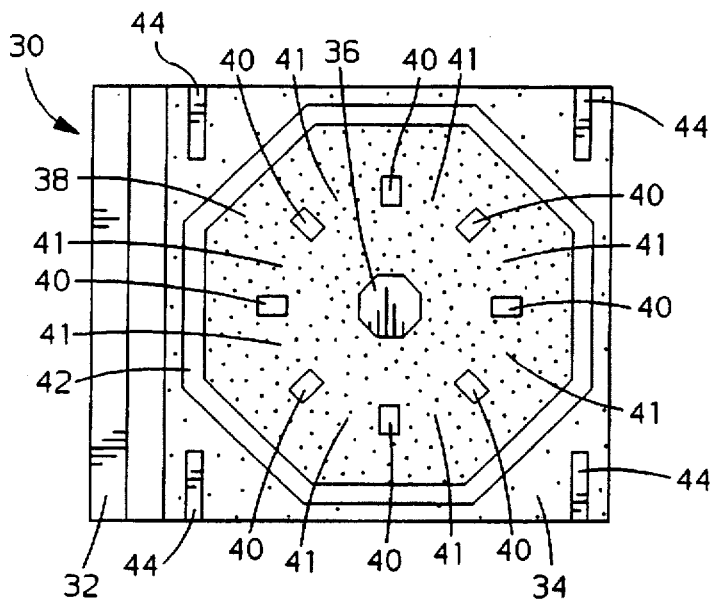
FIG. 5 is an illustration of an emitter having "half seed" holes defining resistive emitter diffusion sections in a radial pattern according to the present invention.

FIG. 5 is an illustration of an emitter according to the present invention having "half seeds". In this structure, the holes or seeds are half the size that of FIG. 4. For example, the "half seed" holes have a length ranging from about 5 µm to about 25 µm and a width ranging from about 4 µm to about 20 µm, and preferably a length of 7 microns and a width of 6 microns. The "half seed" structure provides a greater area in the emitter diffusion between adjacent holes for current to flow and to produce less ballast resistance. The "half seed" structure can be used around the periphery of a power device where the temperature is lower.

Figure 6:
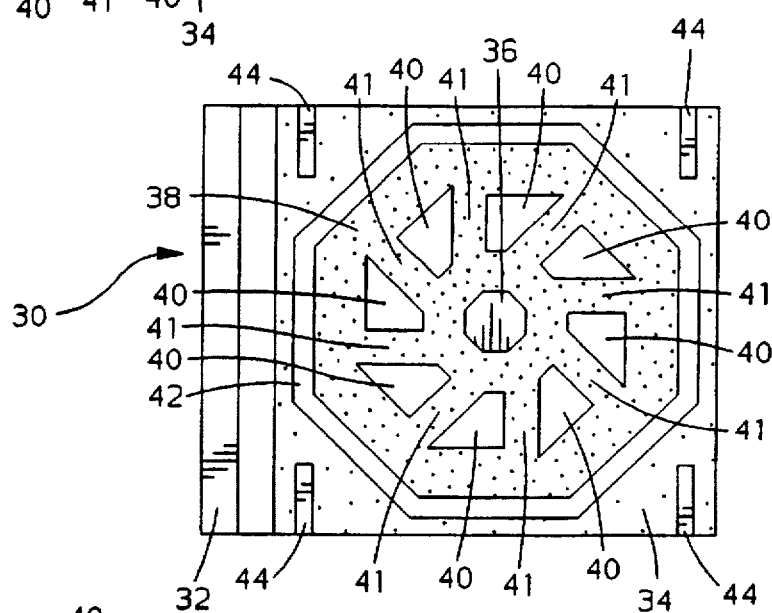
FIG. 6 is an illustration of an emitter having a full, fan blade-shaped holes defining resistive emitter diffusion section in a radial pattern according to the present invention.

FIG. 6 illustrates an emitter according to the present invention having holes shaped in a full fan blade configuration. In this configuration the rectangular-shaped seed as illustrated in FIG. 4 is extended along one end a distance ranging from about 10 µm to about 50 µm and preferably 16 microns. The resulting partial fan blade seed has a parallel rhombus shape. This configuration is advantageous because the lesser area in the emitter diffusion between adjacent holes for current to flow and thus has the most ballast resistance. Thus, it can be used in the center of a power device where the temperature is the highest.

Figure 7:
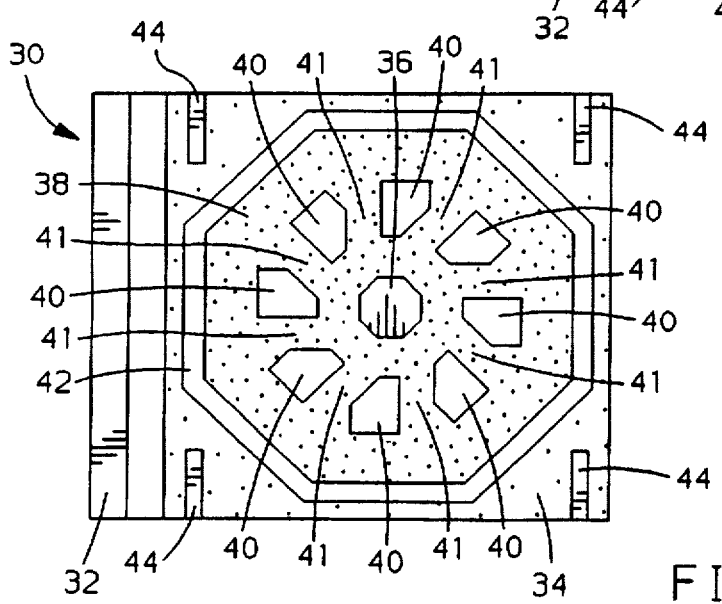
FIG. 7 is an illustration of another emitter having a fan blade-shaped holes defining resistive emitter diffusion section in a radial pattern according to the present invention.

FIG. 7 illustrates an emitter according to the present invention wherein the rectangular-shaped seeds of FIG. 4 are extended along one end a length ranging from about 0 µm to about 16 µm and preferably about 8 microns to form a pentagon-shaped fan blade seed. The pentagon-shaped fan blade seed is advantageous because of the ballast resistance can be varied between the standard kiwi structure and the fan blade structure. These can be used to better even out the temperature profile across the power device.

The following illustrates selective advantages of the present invention.

Figure 1:
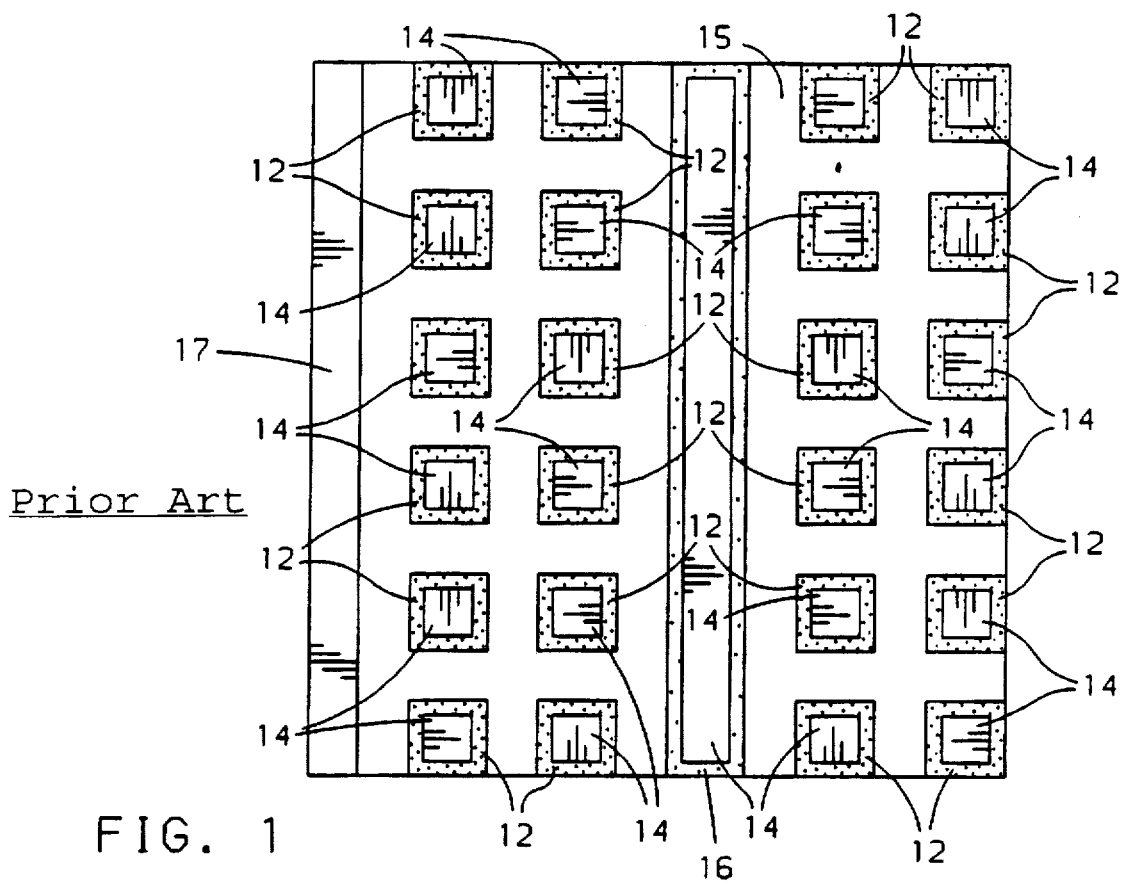
FIG. 1 is an illustration of a prior art vertical PNP device.
Figure 2:
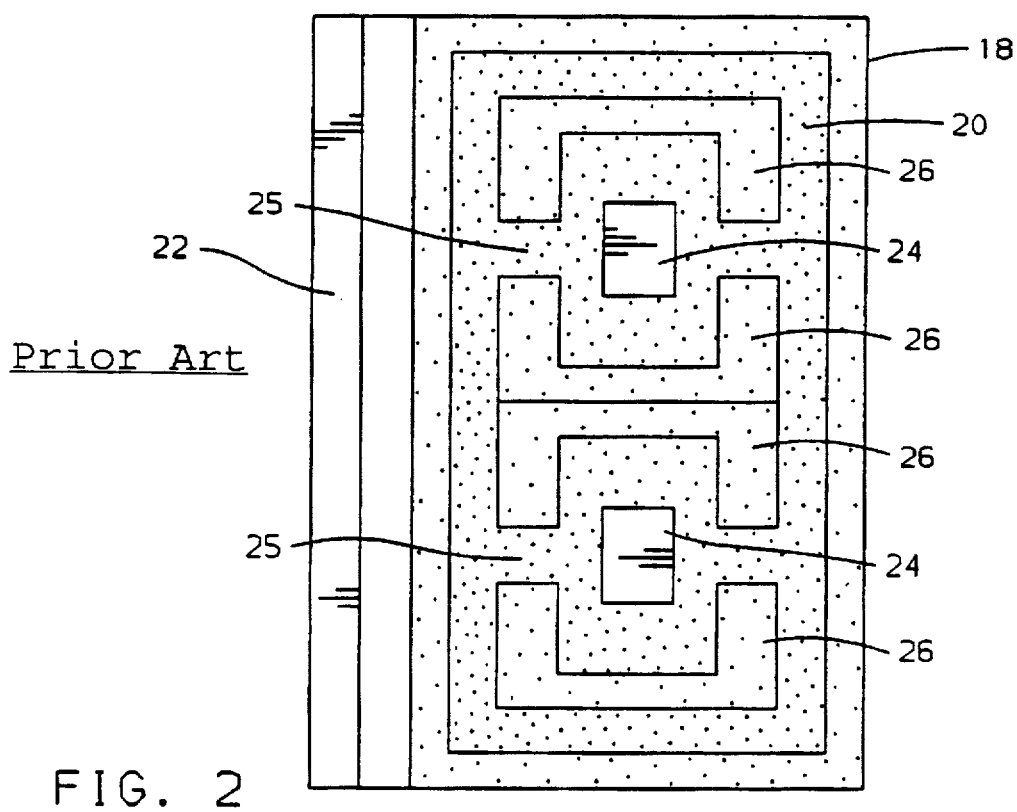
FIG. 2 is an illustration of a prior art NPN emitter.

The ruggedness of the kiwi vertical PNP transistor as illustrated in FIG. 3 was compared with a conventional PNP transistor as illustrated in FIG. 1. Large, 10,000 sq. mil. power vertical PNP transistors were fabricated for the kiwi vertical PNP as illustrated in FIG. 3 and for a conventional PNP transistor as illustrated in FIG. 1. All measurements were made for 10 milliseconds durations and at 40 volts, with the current being changed to vary the power levels until the device exploded. The conventional PNP as illustrated in FIG. 1, which has no ballast resistance, was found to withstand 72 watts before failure. The kiwi vertical PNP as illustrated in FIG. 3 was found to withstand 360 watts. A five fold increase in the ruggedness of kiwi vertical PNP transistors over conventional PNP achieved.

The embodiments of the invention in which an exclusive property or privilege is claimed are defined as follows:

1. A PNP power device comprising a plurality of vertical PNP transistors, each of the plurality of vertical PNP transistors comprising:
    a silicon material having a surface,
    a collector region formed in the surface of the silicon material,
    a base region formed in the surface of the silicon material such that at least a portion of the base region is laterally disposed adjacent a portion of the collector region,
    an emitter diffusion in the base region such that a portion of the base region is laterally disposed between the collector region and the emitter diffusion at the surface of the silicon material, and such that a perimeter of the emitter diffusion forms a junction with the base region,
    the emitter diffusion having an emitter contact located centrally therein so as to establish lateral on-current flow through the emitter diffusion between the emitter contact and the collector region, and
    a plurality of holes formed in the emitter diffusion so as to be disposed in the surface of the silicon material between the emitter contact and the collector region, the plurality of holes being uniformly spaced apart in a radial pattern with respect to the emitter contact so that a resistive emitter diffusion section is defined between each pair of adjacent holes, the resistive emitter diffusion sections defining a radial pattern with respect to the emitter contact, the resistive emitter diffusion sections providing ballast resistance for the lateral on-current flow through the emitter diffusion between the emitter contact and the collector region such that the entire perimeter of the emitter diffusion is active as a source of current at the junction between the emitter diffusion and the base region,
    wherein the plurality of holes of at least two of the plurality of vertical PNP transistors are of different size such that the PNP power device is characterized by at least a first vertical PNP transistor having a lesser ballast resistance than a second vertical PNP transistor.

2. A device as set forth in claim 1 wherein the first vertical PNP transistor is located closer to a periphery of the PNP power device than the second vertical PNP transistor.

3. A device as set forth in claim 1 wherein each hole of the plurality of holes of the first vertical PNP transistor has a pentagonal shape.

4. A device as set forth in claim 1 wherein each hole of the plurality of holes of the first vertical PNP transistor is rectangularly shaped.

5. A device as set forth in claim 3 wherein each hole of the plurality of holes of the second vertical PNP transistor has a parallel rhombus shape.

6. A device as set forth in claim 3 wherein the first vertical PNP transistor is located closer to a periphery of the PNP power device than the second vertical PNP transistor.

7. A device as set forth in claim 4 wherein each hole of the plurality of holes of the second vertical PNP transistor has a fan blade shape.

8. A device as set forth in claim 4 wherein each hole of the plurality of holes of the second vertical PNP transitor has a parallel rhombus shape.

9. A device as set forth in claim 4 wherein each hole of the plurality of holes of the second vertical PNP transistor has a pentagonal shape.

10. A device as set forth in claim 4 wherein each hole of the plurality of holes of the second vertical PNP transistor has a larger rectangular shape than the rectangular shape of the plurality of holes of the first vertical PNP transistor.

11. A device as set forth in claim 4 wherein the first vertical PNP transistor is located closer to a periphery of the PNP power device than the second vertical PNP transistor.

12. A device as set forth in claim 7 wherein the first vertical PNP transistor is located closer to a periphery of the PNP power device than the second vertical PNP transistor.

13. A device as set forth in claim 8 wherein the first vertical PNP transistor is located closer to a periphery of the PNP power device than the second vertical PNP transistor.

14. A device as set forth in claim 9 wherein the first vertical PNP transistor is located closer to a periphery of the PNP power device than the second vertical PNP transistor.

15. A device as set forth in claim 10 wherein the first vertical PNP transistor is located closer to a periphery of the PNP power device than the second vertical PNP transistor.

* * * * *